US007595552B2

(12) United States Patent
Chung

(10) Patent No.: US 7,595,552 B2
(45) Date of Patent: Sep. 29, 2009

(54) STACKED SEMICONDUCTOR PACKAGE IN WHICH SEMICONDUCTOR PACKAGES ARE CONNECTED USING A CONNECTOR

(75) Inventor: Qwan Ho Chung, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/953,182

(22) Filed: Dec. 10, 2007

(65) Prior Publication Data

US 2009/0108430 A1 Apr. 30, 2009

(30) Foreign Application Priority Data

Oct. 31, 2007 (KR) ...................... 10-2007-0110620

(51) Int. Cl.
*H01L 23/02* (2006.01)

(52) U.S. Cl. ....................... 257/686; 257/685; 257/777; 257/E23.085; 257/E23.169

(58) Field of Classification Search ................. 257/777, 257/723, E25.005, E23.006, E23.085, E21.021–E21.027, 257/685, 686, E23.169
See application file for complete search history.

(56) References Cited

U.S. PATENT DOCUMENTS 5,376,825 A * 12/1994 Tukamoto et al. ........... 257/685

FOREIGN PATENT DOCUMENTS

KR 1020020039012 A 5/2002
KR 1020060068971 A 6/2006

* cited by examiner

*Primary Examiner*—Jasmine J Clark
(74) *Attorney, Agent, or Firm*—Ladas & Parry LLP

(57) ABSTRACT

A stacked semiconductor package includes a semiconductor package module in which a plurality of semiconductor packages, which include a substrate and a semiconductor chip mounted over the substrate, are stacked. The stacked semiconductor package includes connectors for electrically connecting pairs of adjacent semiconductor packages so as to provide sequentially a signal from a lower semiconductor package of the semiconductor package module toward an upper semiconductor package. The stacked semiconductor package gives the semiconductor packages in the stacked semiconductor package the ability to cooperate with one another.

11 Claims, 7 Drawing Sheets

100
40
30
20
10
300
44
34
24
14
200
220
215
210
230
225
250
42
48
32
38
22
28
12
18

STACKED SEMICONDUCTOR PACKAGE IN WHICH SEMICONDUCTOR PACKAGES ARE CONNECTED USING A CONNECTOR

CROSS-REFERENCE TO RELATED APPLICATIONS

The present application claims priority to Korean patent application number 10-2007-0110620 filed on Oct. 31, 2007, which is incorporated herein by reference in its entirety.

BACKGROUND OF THE INVENTION

The present invention relates generally to a stacked semiconductor device, and more particularly to a stacked semiconductor package in which a lower semiconductor package and an upper semiconductor package are electrically connected using a connector.

Recent developments have led to semiconductor devices that store massive amounts of data and that process the stored data in a short period of time.

A typical semiconductor device is fabricated using a semiconductor chip fabrication process for forming a semiconductor chip by integrating devices such as transistors, resistors, and capacitors and a packaging process for singulating the semiconductor chip and electrically connecting the semiconductor chip to an external circuit substrate and for protecting the semiconductor chip, which are typically weak and brittle, from external impact and/or vibration.

Recent technical developments in the package process have lead to a chip scale package having a size of no more than 100% to 105% of the size of a semiconductor chip and a stacked semiconductor package in which a plurality of semiconductor chips or a plurality of semiconductor packages are stacked.

In the stacked semiconductor package, signal transferring technology for providing a signal from a lower semiconductor package to an upper semiconductor package is very important.

A stacked semiconductor package, in which a plurality of semiconductor packages are stacked, requires technology that sequentially provides a signal from a lower semiconductor package to an upper semiconductor package.

SUMMARY OF THE INVENTION

Embodiments of the present invention are directed to a stacked semiconductor package in which a lower semiconductor package and an upper semiconductor package are electrically connected using a connector.

In one embodiment, a stacked semiconductor package comprises a semiconductor package module in which a plurality of semiconductor packages, which include a substrate and a semiconductor chip, mounted over the substrate are stacked; and a connector for electrically connecting a pair of adjacent semiconductor packages so as to sequentially provide a signal from a lower semiconductor package of the semiconductor package module toward an upper semiconductor package.

The connector includes at least two conductive connector bodies for electrically connecting a pair of adjacent substrates and an insulation member interposed between the connector bodies.

Alternatively, the connector may include an insulation body for mechanically connecting a pair of the adjacent substrates, and at least two conductive patterns disposed over the surface of the insulation body and electrically connecting the pair of the adjacent substrates.

The stacked semiconductor package may further comprise an output connector for outputting a signal from the semiconductor package module.

The output connector is outputs a signal from an uppermost semiconductor package in the semiconductor package module to a lowermost semiconductor package in the semiconductor package module.

Each substrate has a first via hole disposed at a first edge and into which a first connector is inserted; and a second via hole disposed at a second edge opposite to the first edge and into which a second connector is inserted.

A conductive layer is formed at an inside surface of each substrate formed with the first and second via holes and each conductive layer is electrically connected with each semiconductor chip.

The semiconductor package module may include four semiconductor packages that are sequentially disposed labeled as first through fourth semiconductor packages.

In the semiconductor package module including four semiconductor packages, the first connector includes a first conductive connector body for electrically connecting the first via holes of the first and second semiconductor packages; and a second conductive connector body for electrically connecting the first via holes of the third and fourth semiconductor packages. The second connector includes a third conductive connector body for electrically connecting the second via holes of the second and third semiconductor packages.

Alternative, each substrate may have a first recess part disposed at a first edge of the substrate and coupled to the first connector, and a second recess part disposed at a second edge opposite to the first edge and coupled to the second connector, rather than the via holes formed in the substrates The first and the second recess parts may have a groove shape.

The stacked semiconductor package may further comprise a support member inserted between the substrates and having a through hole into which the connector in inserted.

In another embodiment, a stacked semiconductor package comprises a first circuit board formed with first via holes along an edge thereof; a second circuit board having second via holes corresponding to the first via holes; a connector module including a pin shaped connector for connecting the first via hole and the second via hole; a first semiconductor package mounted over the first circuit board using solder balls; and a second semiconductor package mounted over the second circuit board using solder balls.

The connector module includes a connector support block interposed between the first and the second circuit boards and through which the connector passes.

The stacked semiconductor package may further comprise solders for electrically connecting the connector and the first and the second circuit boards.

DESCRIPTION OF SPECIFIC EMBODIMENTS

Figure 1:
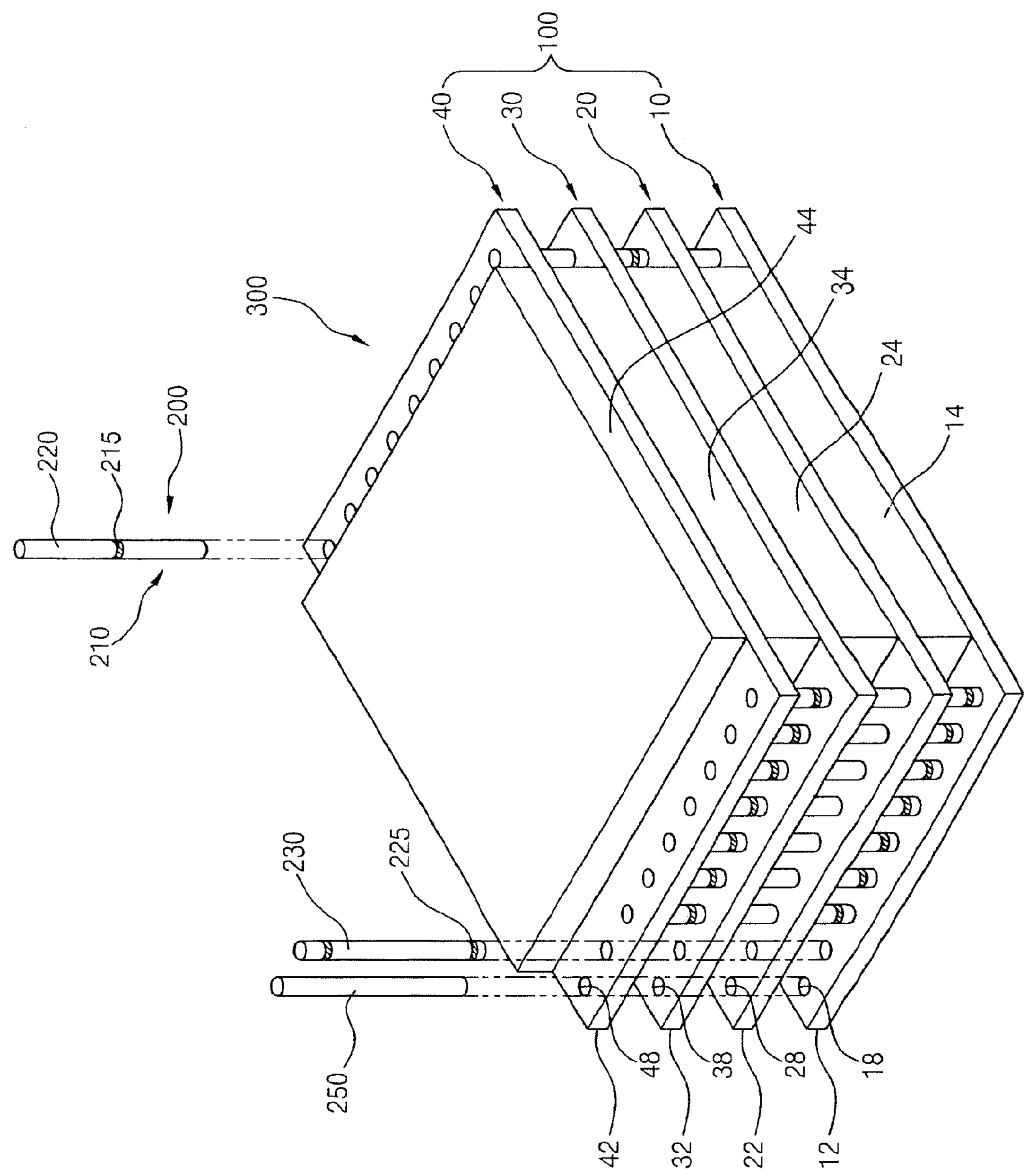
FIG. 1 is a partially broken perspective view showing a stacked semiconductor package in accordance with an embodiment of the present invention.
Figure 2:
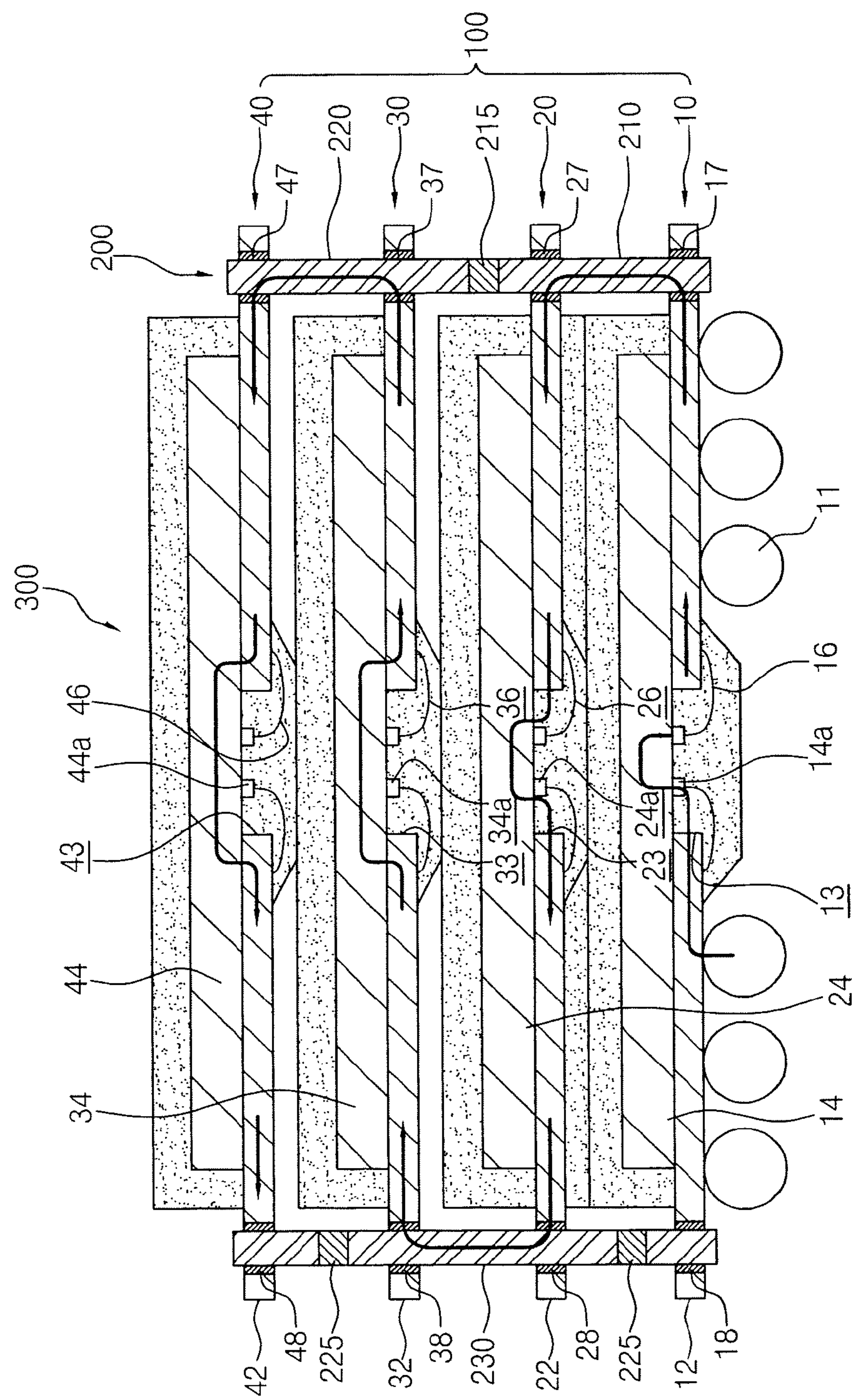
FIG. 2 is a cross-sectional view showing the inside of the structure shown in FIG. 1.

FIG. 1 is a partially broken perspective view showing a stacked semiconductor package in accordance with an embodiment of the present invention. FIG. 2 is a cross-sectional view illustrating the inside of the structure shown in FIG. 1.

Referring to FIGS. 1 and 2, the stacked semiconductor package 300 includes a semiconductor package module 100 and a connector 200.

The semiconductor package module 100 includes a plurality of semiconductor packages 10, 20, 30, and 40. In the present invention shown in FIG. 1, the semiconductor package module 100 includes, for example, four stacked semiconductor packages. Although the semiconductor package module 100 shown in FIG. 1 includes only four semiconductor packages, the semiconductor package module 100 may include even more semiconductor packages.

In the present invention, the four semiconductor packages 10, 20, 30 and 40 included in the semiconductor package module 100 will be referred to as first through fourth semiconductor packages 10, 20, 30, and 40. The first through fourth semiconductor packages 10 through 40 are sequentially disposed, for example, the first semiconductor package 10 is disposed at the lowermost part of the semiconductor package module 100 and the fourth semiconductor package 40 is disposed at the uppermost part of the semiconductor package module 100.

As shown in FIG. 2, a plurality of solder balls 11 are electrically connected to the first semiconductor package 10 disposed, i.e. the lowermost semiconductor package of the first through fourth semiconductor packages 10, 20, 30, and 40 included in the semiconductor package module 100. An input signal is applied to the solder balls 11 from an outside source, or the first through fourth semiconductor packages 10, 20, 30, and 40 provides an output signal to the solder balls 11.

The first semiconductor package 10 includes a first substrate 12 and a first semiconductor chip 14.

The first substrate 12 may be, for example, a printed circuit board having a plate shape. An opening 13 having a slit shape is formed at a center portion of the first substrate 12, and a plurality of connection pads (not shown) is disposed at a vicinity of the opening 13.

The first semiconductor chip 14 is disposed over the first substrate 12. Bonding pads **14*a* are arranged on the center portion of the first semiconductor chip 14 corresponding to the opening 13. The first semiconductor chip 14 having the bonding pads 14*a* is attached to the first substrate 12, and as such the bonding pads 14*a* are exposed through the opening 13**.

The bonding pads **14*a* of the first semiconductor chip 14 are electrically connected to the connection pads (not shown) of the first substrate 12 using a bonding wire 16**.

The second semiconductor package 20 disposed over the first semiconductor package 10 includes a second substrate 22 and a second semiconductor chip 24.

The second substrate 22 may be, for example, a printed circuit board having a plate shape. An opening 23 having a slit shape is formed in a center portion of the second substrate 22, and connection pads (not shown) are disposed in a vicinity of the opening 23.

The second semiconductor chip 24 is disposed over the second substrate 22. Bonding pads **24*a* are arranged in the center portion of the second semiconductor chip 24 corresponding to the opening 23. The second semiconductor chip 24 having the bonding pads 24*a* is attached to the second substrate 22, and as such the bonding pads 24*a* are exposed through the opening 23**.

The bonding pads **24*a* of the second semiconductor chip 24 are electrically connected to the connection pads (not shown) of the second substrate 22 using a bonding wire 26**.

The third semiconductor package 30 disposed over the second semiconductor package 20 includes a third substrate 32 and a third semiconductor chip 34.

The third substrate 32 may be, for example, a printed circuit board having a plate shape. An opening 33 having a slit shape is formed in a center portion of the third substrate 32, and connection pads (not shown) are disposed in a vicinity of the opening 33.

The third semiconductor chip 34 is disposed over the third substrate 32. Bonding pads **34*a* are arranged at the center portion of the third semiconductor chip 34 corresponding to the opening 33. The third chip 34 having the bonding pads 34*a* is attached to the third substrate 32, and as such the bonding pads 34*a* are exposed through the opening 33**.

The bonding pads **34*a* of the third semiconductor chip 34 are electrically connected to the connection pads (not shown) of the second substrate 32 using a bonding wire 36**.

The fourth semiconductor package 40 disposed over the third semiconductor package 30 includes a fourth substrate 42 and a fourth semiconductor chip 44.

The fourth substrate 42 may be, for example, a printed circuit board having a plate shape. An opening 43 having a slit shape is formed in a center portion of the fourth substrate 42, and connection pads (not shown) are disposed in a vicinity of the opening 43.

The fourth semiconductor chip 44 is disposed over the fourth substrate 42. Bonding pads **44*a* are arranged at the center portion of the fourth semiconductor chip 44 corresponding to the opening 43. The fourth chip 44 having the bonding pads 44*a* is attached to the fourth substrate 42, and as such the bonding pads 44*a* are exposed through the opening 43**.

The bonding pads **44*a* of the fourth semiconductor chip 44 are electrically connected to the connection pads (not shown) of the fourth substrate 42 using a bonding wire 46**.

The first through fourth semiconductor packages 10, 20, 30, and 40 described specifically above can operate separately from one another. However, the first through fourth semiconductor packages 10, 20, 30, and 40 cannot cooperate with one another because there are no connection members for connecting the first through fourth semiconductor packages 10, 20, 30, and 40 to one another.

In the present invention, in order to give the first through fourth semiconductor packages 10, 20, 30, and 40 the ability to cooperate with one another, the first through fourth substrates 12, 22, 32, and 42 include first via holes 17, 27, 37, and 47 and second via holes 18, 28, 38, and 48 respectively. The first via holes 17, 27, 37, and 47 and the second via holes 18, 28, 38, and 48 are electrically connected via connectors 200.

The first via holes 17, 27, 37, and 47 penetrate the first through fourth substrates 12, 22, 32, and 42 at a corresponding first edge of the first through fourth substrates 12, 22, 32 and 42. The first via holes 17, 27, 37 and 47 are each aligned at the first edge. When viewed from the top, a plurality of each of the first via holes 17, 27, 37, and 47 are formed in a line along the corresponding first edge of the first through fourth substrates 12, 22, 32, and 42 respectively, as shown in FIG. 1.

The second via holes 18, 28, 38, and 48 penetrate the first the fourth substrate at a corresponding second edge that is opposite the first edge of the first through fourth substrates 12, 22, 32, and 42. The second via holes 18, 28, 38, and 48 are also each aligned with one another. When viewed from the top, a plurality of each of the second via holes 18, 28, 38, and 48 is formed in a line along the corresponding second edge (which is opposite to the first edge) of the first through fourth substrates 12, 22, 32, and 42 respectively, as shown in FIG. 1.

The connector 200 includes a first conductive connector body 210 and a second conductive connector body 220. In addition, an output connector 250 may also be included.

Figure 3:
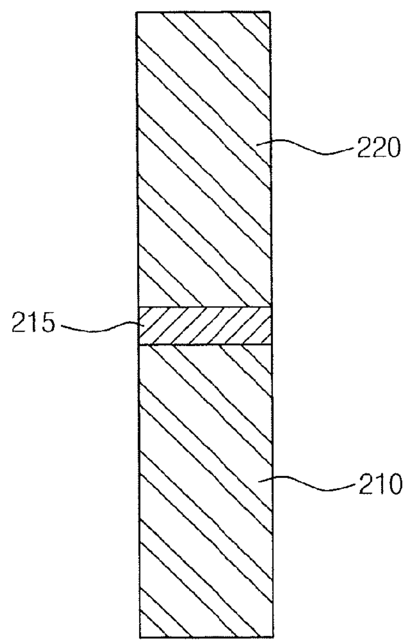
FIG. 3 is a cross-sectional view showing the first connector and the second connector shown in FIG. 1.

FIG. 3 is a cross-sectional view of the first conductive connector body 210 and the second conductive connector body 220 shown in FIG. 1.

Referring to FIG. 3, the first conductive connector body 210 and the second conductive connector body 220 are arranged, for example, in a series, and an insulation member 215 is interposed between the first conductive connector body 210 and the second conductive connector body 220. In the present invention, the first conductive connector body 210 and the second conductive connector body 220 may have a cylindrical shape or a hollow pipe shape.

The first conductive connector body 210 electrically connects the first via hole 17 of the first substrate 12 and the first via hole 27 of the second substrate 22, and the second conductive connector body 220 electrically connects the first via hole 37 of the third substrate 32 and the first via hole 47 of the fourth substrate 42. The insulation member 215 between the first conductive connector body 210 and the second conductive connector body 220 keeps a signal applied to the first conductive connector body 210 from being applied to the second conductive connector body 220.

Figure 4:
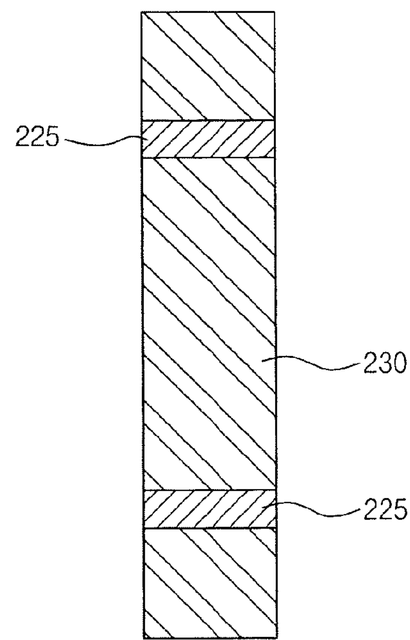
FIG. 4 is a cross-sectional view showing the third connector shown in FIG. 1.

FIG. 4 is a cross-sectional view illustrating a third conductive connector body shown in FIG. 1.

Referring to FIG. 4, the third conductive connector body 230 electrically connects the second via hole 28 of the second substrate 22 and the second via hole 38 of the third substrate 32. Insulation members 225 may be formed in the third conductive connector body 230 to keep a signal applied to the third conductive connector body 230 from traveling to the first substrate 10 or the fourth substrate 40.

Referring again to FIG. 1, the present invention may further include the output connector 250. The output connector 250 receives a signal from the fourth semiconductor package 40 and outputs it to the first semiconductor package 10. In this present invention, although the connector 200 includes the first and second conductive connector bodies 210 and 220 insulated from the insulation member 215 or the third conductive connector body 230 insulated from the insulation member 225, but the first through third connector bodies may include an insulation body for mechanically connecting a pair of the adjacent substrates, and at least two conductive patterns disposed over the surface of the insulation body and electrically connecting the pair of adjacent substrates.

Referring again to FIG. 2, the solder balls 11 are electrically connected to a ball land (not shown) of the first substrate 12 of the first semiconductor package 10. An input signal may be input from an outside source is applied to the solder ball 11, or an output signal may be output to an outside source from the solder ball 11.

The input signal input to the solder ball 11 is applied to the first semiconductor chip 14 of the first semiconductor package 10. The signal is then output from the first semiconductor chip 14 and is applied to the first conductive connector body 210 through the first via hole 17 of the first substrate 12.

The signal applied to the first conductive connector body 210 is then applied through the second substrate 22 and to the second semiconductor chip 24 of the second semiconductor package 20. Thereafter, the signal is output from the second semiconductor chip 24 and is applied through the second via hole 28 of the second substrate 22 and to the third conductive connector body 230.

The signal applied to the third conductive connector body 230 is applied through the third substrate 32 and to the third semiconductor chip 34 of the third semiconductor package 30. Thereafter, the signal output from the third semiconductor chip 34 is applied through the first via hole 37 of the third substrate 32 and to the second conductive connector body 220. The signal applied to the second conductive connector body 220 is applied through the fourth substrate 42 of the fourth semiconductor package 40 and to the fourth semiconductor chip 44. The signal applied to the fourth semiconductor chip 44 and is output through the fourth substrate 42 and to the output connector 250 shown in FIG. 1. The signal is then applied through the output connector 250 and to the first substrate 12 of the first semiconductor package 10. In the present invention, although the signal, for example, is inputted from the first substrate 12 to the fourth substrate 43 using the first and second conductive connector bodies 210 and 220 and then is outputted from the fourth substrate 42 to the first substrate 12 using the output connector 250, but the signal is outputted from each of the first through fourth substrates 12, 22, 32 and 42 because the output connector is electrically connected with each of the first through fourth semiconductor packages 10,20,30 and 40.

The first via holes and the second via holes shown in FIG. 1 are formed in a line. However, alternatively, when there is a large number of the first via holes and the second via holes, the first via holes and the second via holes may be disposed in a zigzag shape over the respective substrates.

Figure 5:
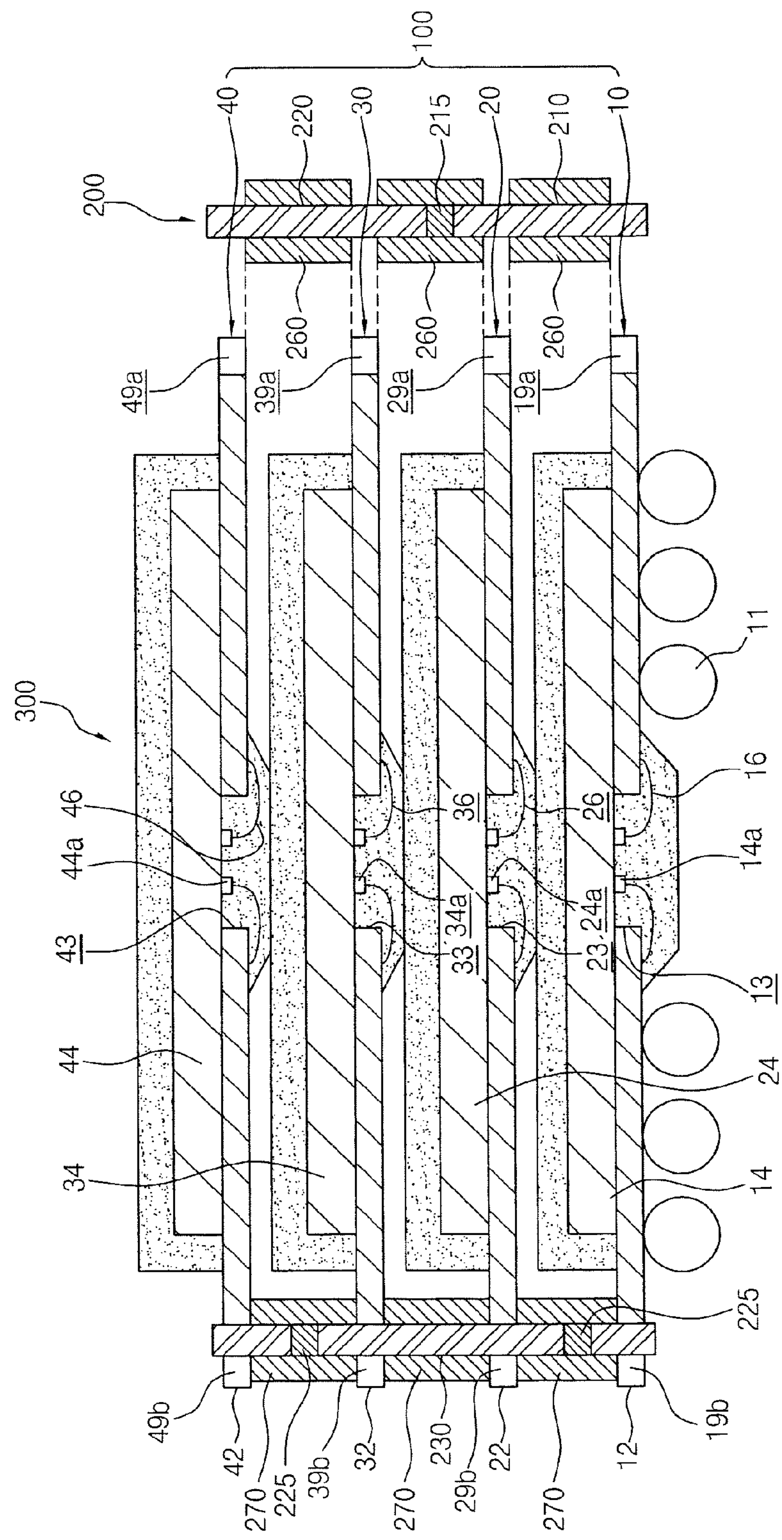
FIG. 5 is a cross-sectional view showing a stacked semiconductor package in accordance with another embodiment of the present invention.
Figure 6:
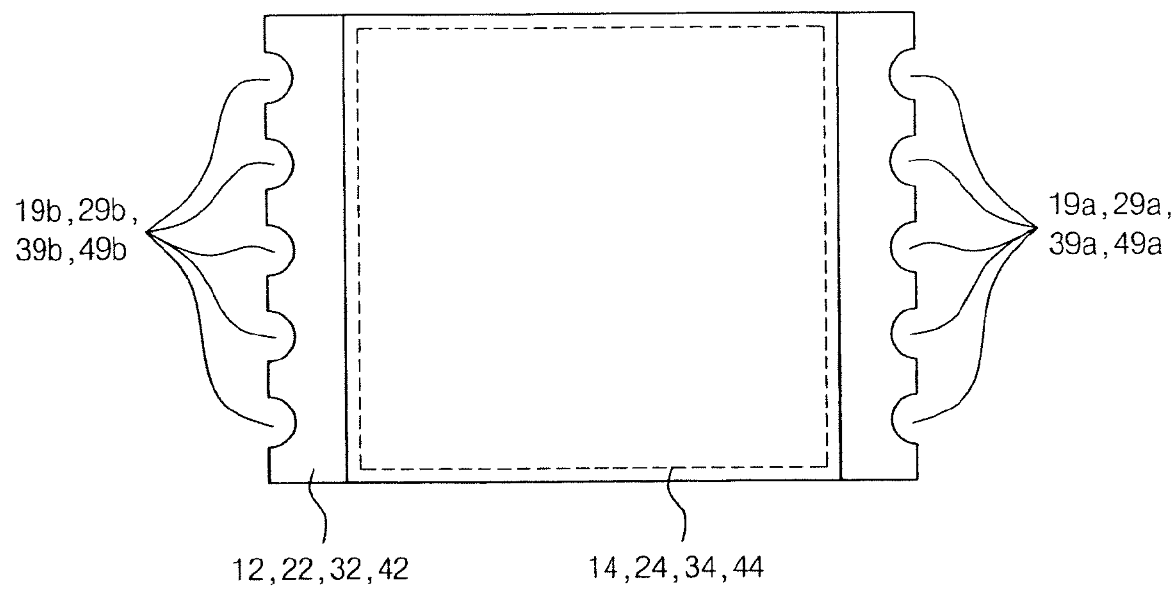
FIG. 6 is a plan view of the stacked semiconductor package of FIG. 5.

Additionally, in the embodiment of the present invention as shown and described in FIGS. 1 through 5, a stacked semiconductor package includes the first via holes and the second via holes formed in the first through fourth substrates 12, 22, 32, and 42 of the first through fourth semiconductor packages 10, 20, 30, and 40 and connectors that are coupled to the first and second via holes. Alternatively, as shown in FIGS. 5 and 6, first recess parts 19*a*, 29*a*, 39*a*, and 49*a* may be formed in a first edge of the first through fourth substrates 12, 22, 32, and 42 of the first through fourth semiconductor packages 10, 20, 30, and 40. And second recess parts 19*b*, 29*b*, 39*b*, and 49*b* may be formed in a second edge that is opposite the first edge.

In the embodiment shown in FIGS. 5 and 6, a first conductive connector body 210 is electrically connected to the first recess parts 19*a* and 29*a*, and a second conductive connector body 220 is electrically connected to the first recess parts 39*a* and 49*a*. An insulation member 215 insulates the first conductive connector body 210 and the second conductive connector body 220 from each other, and a support member 260 is coupled to the first conductive connector body 210 and the second conductive connector body 220. The support member 260 has through holes through which the second conductive connector bodies 220 pass.

A third conductive connector body 230 is electrically connected to the second recess parts 29*b* and 39*b*. The third conductive connector body 230 includes insulation members 225 that insulate the third connector 230 from the second recess parts 19*b* and 49*b*. A support member 270 is coupled to the third conductive connector body 230, and the support member 270 has through holes through which the third conductive connector bodies 230 pass.

Figure 7:
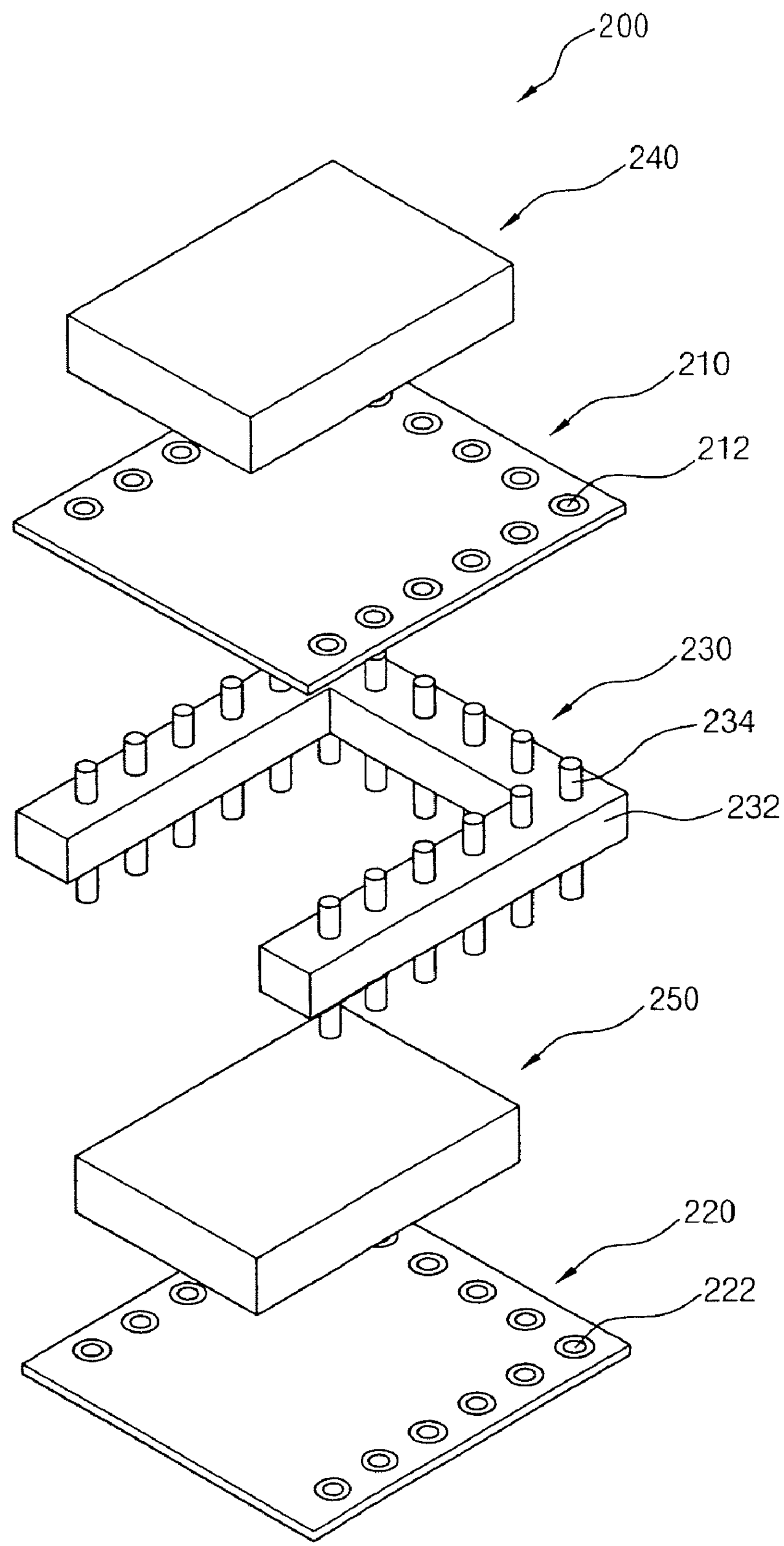
FIG. 7 is an exploded perspective view showing a stacked semiconductor package in accordance with another embodiment of the present invention.
Figure 8:
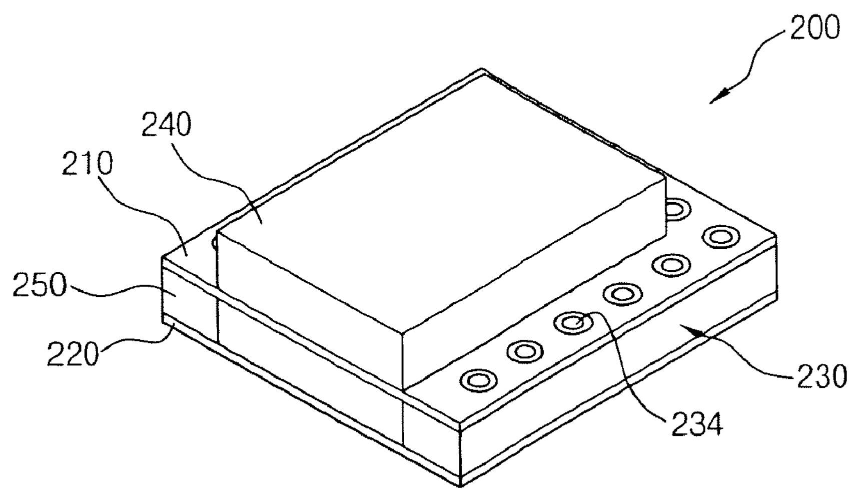
FIG. 8 is an assembled perspective view of FIG. 7.
Figure 9:
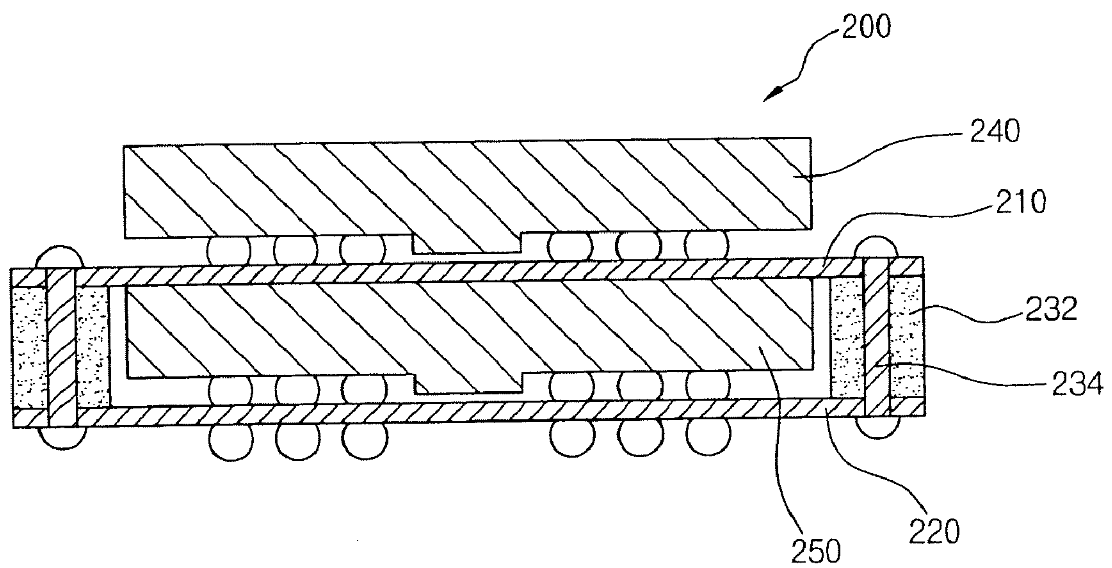
FIG. 9 is a cross-sectional view illustrating the inside of the structure shown in FIG. 8.

FIG. 7 is an exploded perspective view showing a stacked semiconductor package in accordance with another embodiment of the present invention. FIG. 8 is an assembled perspective view of FIG. 7. FIG. 9 is a cross-sectional view illustrating the inside structure of FIG. 8.

Referring to FIGS. 7 through 9, the stacked semiconductor package 200 includes a first circuit board 210, a second circuit board 220, a connector module 230, a first semiconductor package 240, and a second semiconductor package 250.

The first circuit board 210 may have, for example, a rectangular plate shape. The first circuit board 210 may include, for example, four edges and first via holes 212 that are formed along three edges of the first circuit board 212.

The second circuit board 220 may have, for example, a rectangular plate shape. The second circuit board 220 has substantially the same shape and size as the first circuit board 210. Second via holes 222 are formed in the second circuit board 220 in positions corresponding to the first via holes 212.

The connector module 230 is interposed between the first circuit board 210 and the second circuit board 220. The connector module 230 includes a connector support block 232 and connectors 234. The connector support block 232 is interposed between the first circuit board 210 and the second circuit board 220. The connector support block 232 has through holes through which the connectors 234 passes, and the through holes are aligned with the first via holes 212 of the first circuit board 210 and the second via holes 222 of the second circuit board 220.

The connectors 234 are inserted into the through holes of the connector support block 232, and both end parts of each of the connectors 234 project from the connector support block 232. The connectors 234 that project from the connector support block 232 are coupled to the first via hole 212 of the first circuit board 210 and the second via hole 222 of the second circuit board 220. The first via holes 212 and the connectors 234 and the second via holes 222 and the connectors 234 are electrically connected to each other using solder.

The first semiconductor package 240 is electrically connected to the first circuit board 210. The first semiconductor package 240 may be, for example, a ball grid array package (BGA) that includes a substrate (not shown), a semiconductor chip (not shown) disposed over a surface of the substrate, and a solder ball disposed on the opposite surface of the substrate. The solder ball of the second semiconductor package 250 is electrically connected to the second circuit board 220.

In FIGS. 7 through 9, two circuit boards and two semiconductor packages are shown, however, alternatively, three or more circuit boards and semiconductor packages may be stacked in the stacked semiconductor package in accordance with the present embodiment, and the connector may have the structure shown in FIGS. 1 through 5 when three or more circuit boards are stacked.

In the present embodiment, the circuit boards connected using the connector module are disposed between the semiconductor packages, and it is therefore possible to stack a plurality of semiconductor packages that have already been packaged.

As is apparent from the above description, in the present invention, a pin shaped connector including an insulation member and a conductive member is coupled to a stacked semiconductor package; and therefore, the present invention is capable of taking a signal input from an outside source and be sequentially inputting the signal to a plurality of semiconductor packages.

Although specific embodiments of the present invention have been described for illustrative purposes, those skilled in the art will appreciate that various modifications, additions and substitutions are possible without departing from the scope and the spirit of the invention as disclosed in the accompanying claims.

What is claimed is:

1. A stacked semiconductor package, comprising:

a semiconductor package module having a plurality of stacked semiconductor packages, wherein each semiconductor package includes a substrate and a semiconductor chip mounted over the substrate; and a first connector and a second connector for electrically connecting a pair of adjacent semiconductor packages to sequentially provide a signal from a lower semiconductor package of the semiconductor package module toward an upper semiconductor package, wherein the first and second connectors include at least two conductive connector bodies, each conductive connector body electrically connecting a pair of adjacent substrates, and an insulation member interposed between the conductive connector bodies.

2. The stacked semiconductor package according to claim 1, further comprising an output connector for outputting a signal from the semiconductor package module.

3. The stacked semiconductor package according to claim 2, wherein the output connector is electrically connected with each of the semiconductor packages.

4. The stacked semiconductor package according to claim 1, wherein each substrate comprises:

a first via hole disposed at a first edge of the substrate, wherein the first connector is inserted into the first via hole; and a second via hole disposed at a second edge opposite to the first edge, wherein the second connector penetrates the second via hole.

5. The stacked semiconductor package according to claim 4, wherein the substrates are electrically connected to the corresponding semiconductor chip.

6. The stacked semiconductor package according to claim 4, wherein the semiconductor package module includes a first semiconductor package, a second semiconductor package, a third semiconductor package, and a fourth semiconductor package which are sequentially stacked.

7. The stacked semiconductor package according to claim 6, wherein:

the first connector comprises:

a first conductive connector body electrically connecting the first via hole of the first semiconductor package to the first via hole of the second semiconductor package; and a second conductive connector body electrically connecting the first via hole of the third semiconductor package to the first via hole of the fourth semiconductor package;

each second connector comprises:

a third conductive connection body electrically connecting the second via hole of the second semiconductor package to the second via hole of the third semiconductor package.

8. The stacked semiconductor package according to claim 1, wherein each substrate has:

a first recess part formed in a first edge of the substrate, wherein the recess part is coupled to the first connector; and a second recess parts formed in a second edge of the substrate opposite to the first edge and coupled to the second connector.

9. The stacked semiconductor package according to claim 8, wherein the first and the second recess parts have a groove shape.

10. The stacked semiconductor package according to claim 8, further comprising support members inserted in areas between the substrates that correspond to the first via holes and areas between the substrates that correspond to the second via holes, wherein the support members have a through hole into which the first connector or the second connector is inserted.

11. A stacked semiconductor package, comprising:

a semiconductor package module haying a plurality of stacked semiconductor packages, wherein each semiconductor package includes a substrate and a semiconductor chip mounted over the substrate; and a first connector and a second connector for electrically connecting a pair of adjacent semiconductor packages to sequentially provide a signal from a lower semiconductor package of the semiconductor package module toward an upper semiconductor package, wherein the first and second connectors include an insulation body for mechanically connecting a pair of the adjacent substrates, and at least two conductive patterns disposed over the surface of the insulation body and electrically connecting the pair of adjacent substrates.

* * * * *